(12) United States Patent
Sawada et al.

(10) Patent No.: US 6,528,832 B1
(45) Date of Patent: *Mar. 4, 2003

(54) PHOTOELECTRIC CONVERSION DEVICE AND IMAGE SENSOR

(75) Inventors: Koji Sawada, Atsugi (JP); Hiraku Kozuka, Hiratsuka (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/684,360

(22) Filed: Oct. 6, 2000

Related U.S. Application Data

(62) Division of application No. 09/085,083, filed on May 26, 1998, now Pat. No. 6,150,682.

(30) Foreign Application Priority Data

May 30, 1997 (JP) .............................................. 9-142193

(51) Int. Cl.[7] .............................................. H01L 31/06
(52) U.S. Cl. ........................ 257/290; 257/291; 257/292
(58) Field of Search ................. 257/290, 291, 257/292; 250/208.1, 214 R

(56) References Cited

U.S. PATENT DOCUMENTS

| | | | |
|---|---|---|---|
| 5,402,171 A | * 3/1995 | Tagami et al. ............... 348/219 |
| 5,614,744 A | 3/1997 | Merrill ........................ 257/291 |
| 5,767,902 A | 6/1998 | Koyama ...................... 348/294 |
| 5,844,238 A | 12/1998 | Sauer et al. ................. 250/332 |
| 5,869,857 A | * 2/1999 | Chen ........................... 257/292 |
| 5,880,691 A | 3/1999 | Fossum et al. ............. 341/162 |
| 5,933,190 A | 8/1999 | Dierickx et al. ............ 348/302 |
| 5,977,576 A | * 11/1999 | Hamasaki ................... 257/292 |
| 6,150,682 A | * 11/2000 | Sawada et al. ............. 257/290 |

\* cited by examiner

*Primary Examiner*—Minh Loan Tran
*Assistant Examiner*—Thomas L Dickey
(74) *Attorney, Agent, or Firm*—Robin, Blecker & Daley

(57) ABSTRACT

An image sensor having a plurality of photodetectors and a source follower, storing photo-charges generated by the photodetectors in gate of a MOS transistor and outputting voltage signals converted from the photo-charges, integrally formed on a single semiconductor substrate. The source follower is configured with p-channel MOS transistors to restrain generation of stray carrier. Further, the p-channel MOS transistor of the source follower on the power source side is formed on an n-type well whose impurity concentration is higher than that of an n-type semiconductor substrate where the p-channel MOS transistor on the ground side is formed. In this configuration, the absolute value of the threshold voltage of the p-channel MOS transistor on the ground side becomes lower than that of the p-channel MOS transistor on the power source side, thus gain of the source follower is increased.

29 Claims, 6 Drawing Sheets

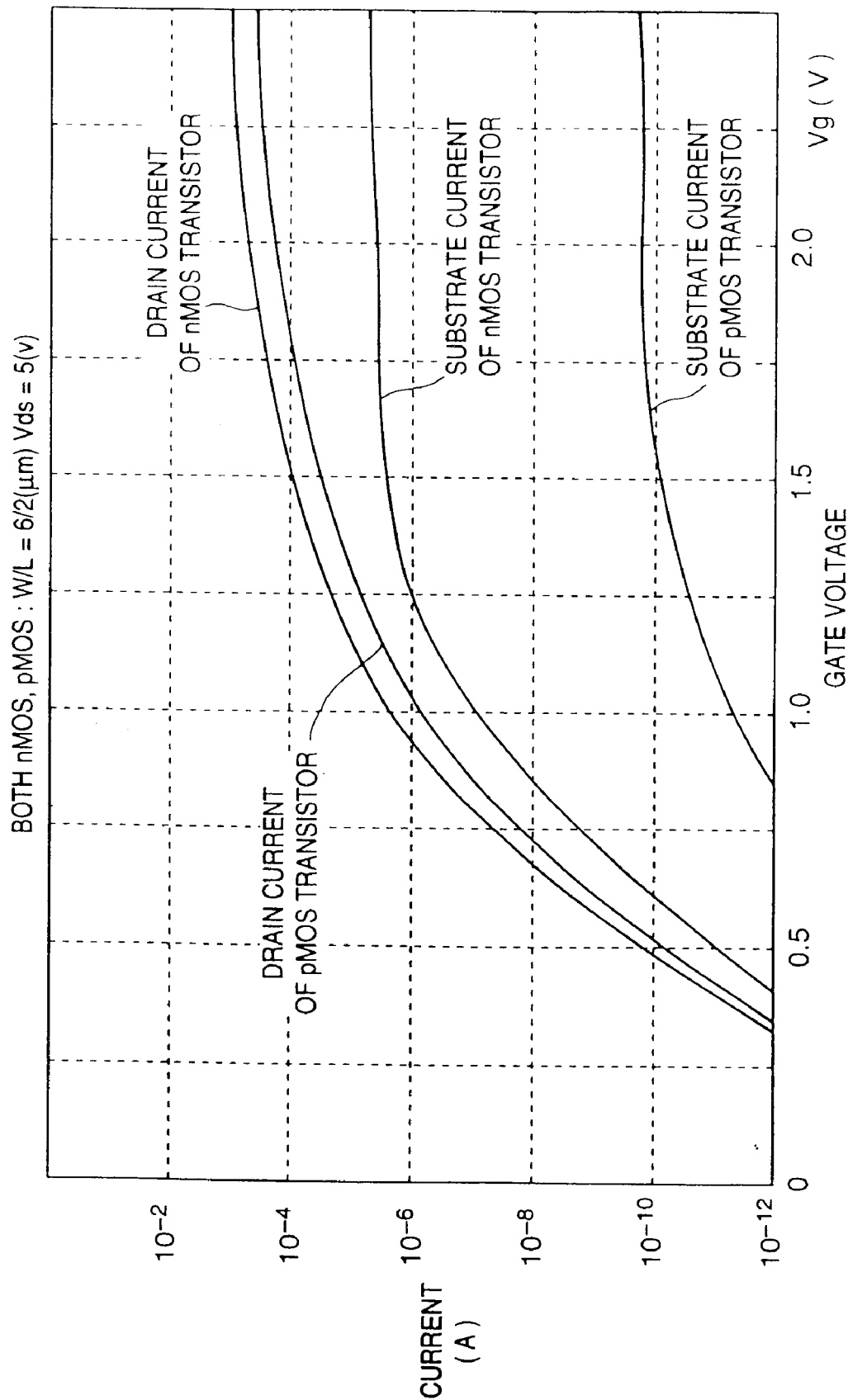

PHOTOELECTRIC CONVERSION DEVICE AND IMAGE SENSOR

CROSS-REFERENCE TO RELATED APPLICATIONS

This application is a divisional of application Ser. No. 09/085,083, filed May 26, 1998, now U.S. Pat. No. 6,150,682.

BACKGROUND OF THE INVENTION

The present invention relates to a photoelectric conversion device and an image sensor and, more particularly, to a photoelectric conversion device and an image sensor having an improved fixed pattern noise characteristics.

Recently, a one- or two-dimensional photoelectric conversion devices having a plurality of photodetectors and a source follower, for storing photo-charges generated by the photodetectors in gate of a MOS transistor and outputting voltage signals converted from the photo-charges, integrally formed on a single semiconductor substrate have been developed. There is a photoelectric conversion device which is disclosed in the Japanese Patent Application Laid-Open No. 9-51085, for instance.

As an example of forming photodetectors and a source follower on a single semiconductor substrate, FIG. 4 shows a circuit configuration of a pixel and FIG. 5 shows a cross sectional view taken along a line B–B' in FIG. 4. The source follower is configured with an n-channel MOS (nMOS) transistor.

The gain of the source follower, $G_{sf}$, is, $$G_{sf} = 1/[1 + 1/(gm \times r_{ds})] \tag{1}$$

gm: mutual conductance of a driving transistor
$r_{ds}$: saturated drain resistance of a load transistor Therefore, a large gain is obtained when the mutual conductance of a driving transistor is large.

Accordingly, a source follower configured with an nMOS transistor having larger mutual conductance than that of a p-channel MOS (pMOS) transistor is generally used.

In a MOS transistor, when a voltage is applied across a drain and a source while a channel is formed by applying a voltage to a gate, the electric field becomes strong in the vicinity of the drain-side edge of the channel, which sometimes generates new electron-hole pairs due to impact ionization. Most of the carrier generated due to the impact ionization becomes substrate current and absorbed by a reference potential of the semiconductor substrate, however, a part of the carrier recombines. The recombination is accompanied by light emission, and the emitted light further generates new electron-hole pairs in the semiconductor substrate. The carrier generated in this manner becomes stray carrier which diffuses over the semiconductor substrate. When the stray carrier enters the photodetectors, ghost signals are generated in addition to essential signals generated in proportion to incident light. These ghost signals are a primary factor of fixed pattern noise in a photoelectric conversion device.

The measurement result, by the applicants of the present invention, of substrate current and drain current with respect to gate voltage Vg of nMOS and pMOS transistors is shown in FIG. 6. In FIG. 6, an abscissa shows the absolute value of the gate voltage, and an ordinate shows substrate current and drain current. The substrate current flowing in the nMOS transistor is about $10^4$ to $10^5$ larger than that in the pMOS transistor, which indicates that more electron-hole pairs are generated due to impact ionization in the nMOS transistor than in the pMOS transistor. Thus, since the fact that more substrate current flows in the nMOS transistor than in the pMOS transistor, stray carrier is more easily generated in a semiconductor substrate of an nMOS transistor than a pMOS transistor.

Further, substrate current in a MOS transistor depends upon the drain-source voltage more than the gate voltage. Experimental results show that the substrate current increases logarithmically with respect to an increase in the drain-source voltage. Accordingly, it is determined that generation of stray carrier can be reduced by lowering the drain-source voltage.

Fixed pattern noise, with respect to a signal level, caused by stray carrier entering a plurality of photodetectors is not ignorable as sensitivity of the photodetectors improves.

SUMMARY OF THE INVENTION

The present invention has been made in consideration of the above situation, and has as its object to reduce fixed pattern noise in a photoelectric conversion device and an image sensor, to reduce fixed pattern noise caused by stray carrier entering photodetectors in a photoelectric conversion device and an image sensor, and to reduce fixed pattern noise caused by stray carrier entering photodetectors in a photoelectric conversion device and an image sensor having a plurality of photodetectors and a source follower, storing photo-charges generated by the photodetectors in gate of a MOS transistor and outputting voltage signals converted from the photo-charges, integrally formed on a single semiconductor substrate.

According to the present invention, the foregoing object is attained by providing a photoelectric conversion device comprising: a photodetector which outputs charge in accordance with quantity of incident light; and an output circuit having a p-channel MOS transistor for outputting a signal corresponding to the charge from the photodetector, wherein the photodetector and the output circuit is formed on a single semiconductor substrate.

Further, the foregoing object is also attained by providing an image sensor comprising: a photodetector which outputs charge in accordance with quantity of incident light; and an output circuit having a p-channel MOS transistor for outputting a signal corresponding to the charge from the photodetector, wherein the photodetector and the output circuit is formed on a single semiconductor substrate.

With the above configurations, fixed pattern noise is reduced.

According to the present invention, the foregoing object is attained by providing a photoelectric conversion device comprising: a photodetector which outputs charge in accordance with quantity of incident light; and an output circuit having a p-channel MOS transistor for outputting a signal corresponding to the charge from the photodetector in order to restrain generation of stray carrier, wherein the photodetector and the output circuit is formed on a single semiconductor substrate.

Further, the foregoing object is also attained by providing an image sensor comprising: a photodetector which outputs charge in accordance with quantity of incident light; and an output circuit having a p-channel MOS transistor for outputting a signal corresponding to the charge from said photodetector in order to restrain generation of stray carrier, wherein said photodetector and said output circuit is formed on a single semiconductor substrate.

With the above configurations, generation of stray carrier is restrained by configuring the output circuit, which is the source of the stray carrier, with the p-channel MOS transistor, fixed pattern noise caused by the stray carrier entering the photodetector is reduced.

According to the present invention, the foregoing object is also attained by providing a photoelectric conversion device comprising: a photodetector which outputs charge in accordance with quantity of incident light; and a source follower, configured with a p-channel MOS transistor, for converting the charge outputted from the photodetector into voltage, wherein the photodetector and the source follower are formed on a single semiconductor substrate.

According to the present invention, the foregoing object is also attained by providing an image sensor having a plurality of photoelectric conversion devices formed on a single semiconductor substrate, wherein each photoelectric conversion device comprises: a photodetector which outputs charge in accordance with quantity of incident light; and a source follower, configured with a p-channel MOS transistor, for converting the charge outputted from the photodetector into voltage, wherein the photodetector and the source follower are formed on a single semiconductor substrate.

With the configuration as described above, by configuring a source follower which is a main source of stray carrier with a pMOS transistor, generation of stray carrier is restrained, thereby fixed pattern noise caused by the stray carrier entering the photodetectors is reduced.

Preferably, the source follower includes two p-channel MOS transistors connected in series, and the charge outputted from the photodetector is applied to a gate of the p-channel MOS transistor on the ground side, and the voltage is outputted from a node between the two p-channel MOS transistors. Further, an absolute value of a threshold voltage of the p-channel MOS transistor on the ground side is set lower than that of the p-channel MOS transistor on the power source side.

With the above configuration, gain of the source follower is increased.

Further, the p-channel MOS transistor on the power source side is formed on an n-type well whose impurity concentration is higher than that of an n-type semiconductor substrate, and the p-channel MOS transistor on the ground side is formed on the n-type semiconductor substrate outside of the n-type well.

With the above configuration, channels of pMOS transistors, having different threshold voltages, forming a source follower are formed in a single manufacturing step.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiment of the invention and, together with the description, serve to explain the principles of the invention.

FIG. 6 is a graph showing substrate current and drain current with respect to gate voltage of MOS transistors.

DETAILED DESCRIPTION OF THE PREFERRED EMBODIMENT

Preferred embodiment of the present invention will be described in detail in accordance with the accompanying drawings.

Figure 1:
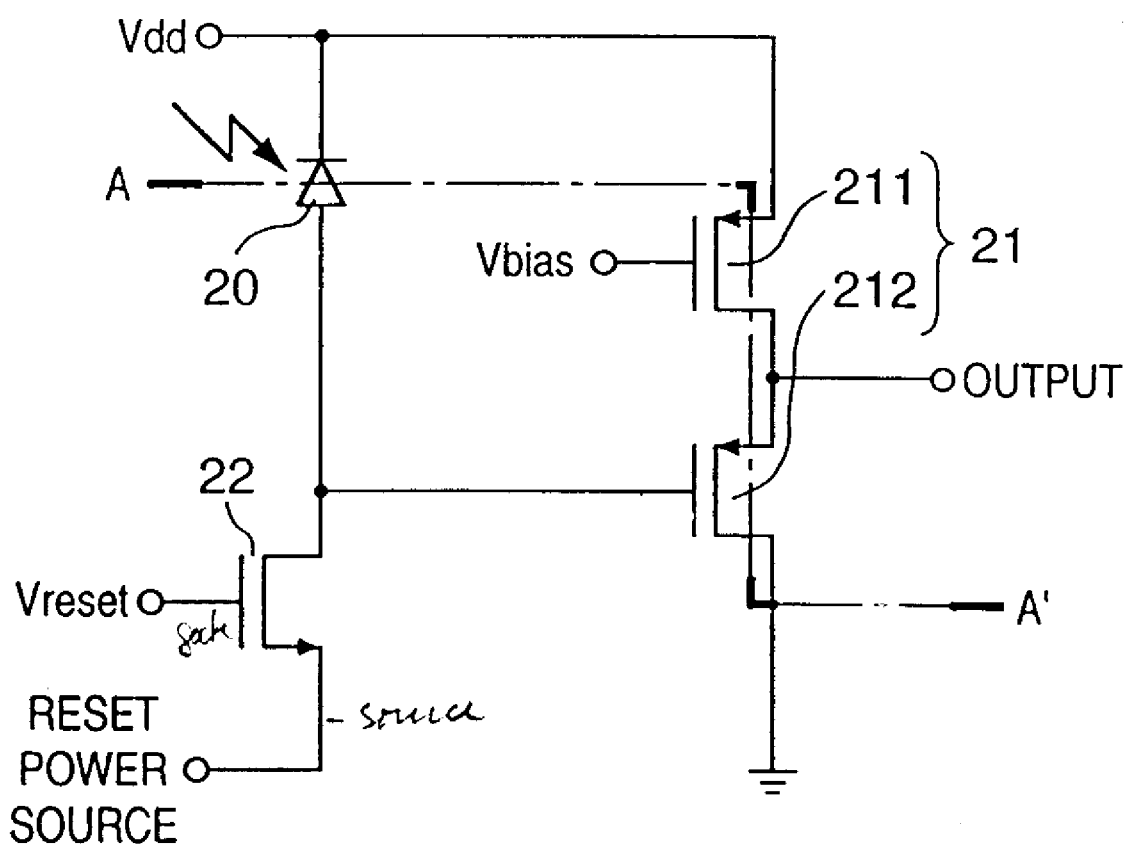
FIG. 1 is a circuit diagram of a pixel of a photoelectric conversion device according to the present invention.
Figure 2:
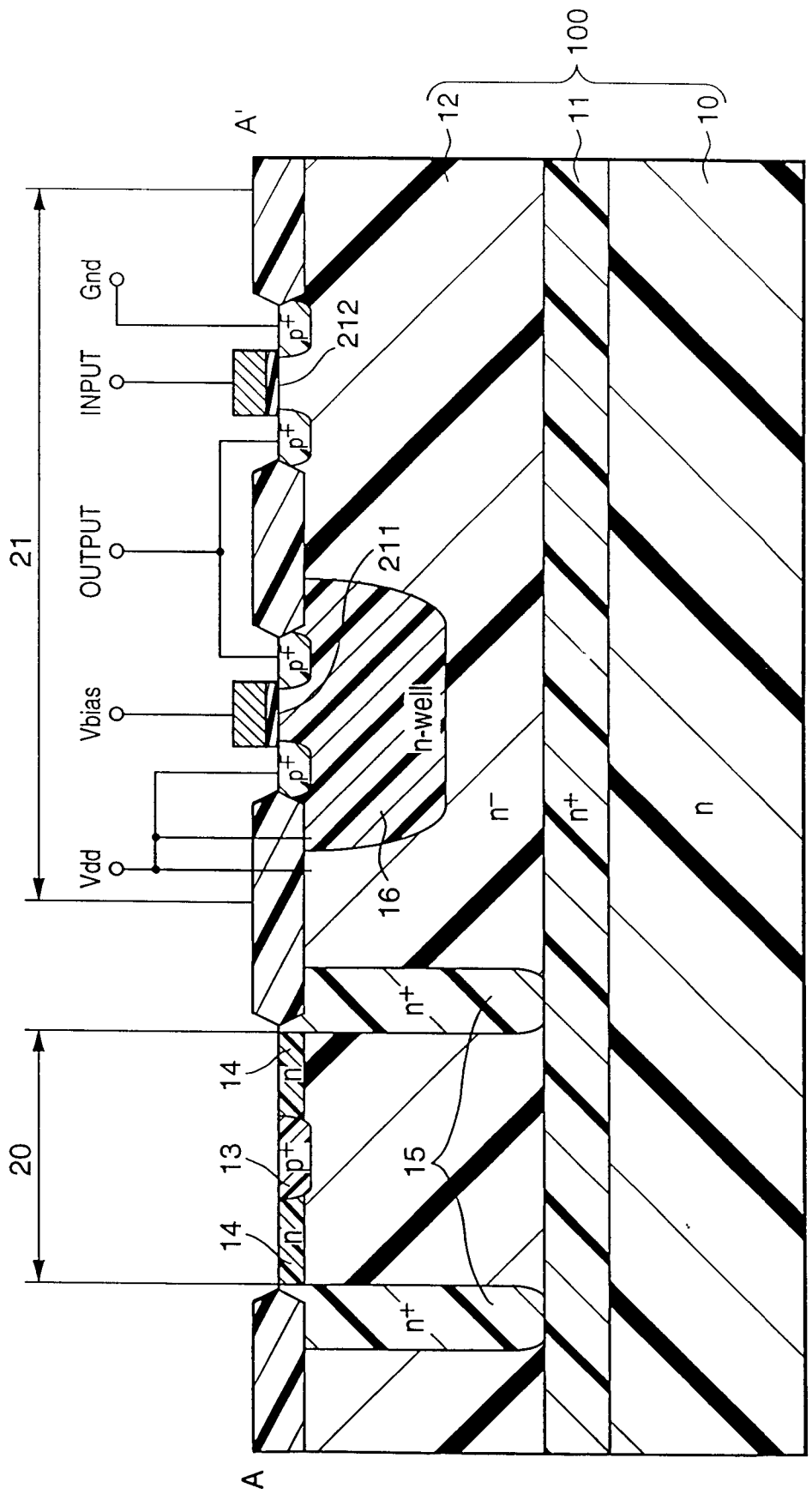
FIG. 2 is a cross-sectional view taken along a line A–A' in FIG. 1.

FIG. 1 is a circuit diagram of a pixel of a photoelectric conversion device, according to the present invention, having a plurality of photodetectors and a source follower formed on a single semiconductor substrate, and FIG. 2 is a cross-sectional view taken along a line A–A' in FIG. 1.

Note, stray carrier which causes fixed pattern noise is of the same conduction type as carrier of photo-signals, and it is a minor carrier in the semiconductor substrate. As for diffusion distance of the minor carrier, the diffusion distance of holes is shorter than that of electrons; therefore, it is effective to use an n-type semiconductor substrate to reduce fixed pattern noise caused by stray carrier entering the photodetectors since the stray carrier generated in peripheral circuits does not easily reach the photodetectors.

In this embodiment, as shown in FIG. 2, an $n^+$ type buried layer 11 is formed on an n type semiconductor substrate 10, further, an $n^-$ type epitaxitial layer 12 is formed on the layer 11. On the surface of the layer 12, a plurality of photodetectors 20 and pMOS source followers 21, each connected to each photodetector 20, are formed.

The photodetectors 20 are formed in such a manner that a plurality of $p^+$ type areas 13 and n type areas 14 are formed on the $n^-$ type epitaxial layer 12. In practice, a large number of photodetectors 20 are formed in the depth direction in FIG. 2 as an array (not shown), and those photodetectors 20 are surrounded by $n^+$ type barrier layers 15. With the foregoing configuration, holes of the minor carrier in the n type semiconductor substrate 10 are partially prevented from entering the photodetectors 20 by potential barrier of $n^+$ type buried layer 11 and the $n^+$ type barrier areas 15.

The photodetector 20 is connected to a reset switch 22, whose source is connected to a reset power source, and gate of a pMOS transistor, on the ground side, which is an input terminal of a source follower 21.

The source follower 21 is configured with two MOS transistors. When these transistors are formed on the same well, one of the transistors has a higher threshold voltage than the other due to back-gate effect. In a source follower configured with pMOS transistors, the one on the ground side, namely, a driving transistor has a higher threshold voltage than the other. This causes a gain drop of the source follower, and induces deterioration of sensitivity.

In order to overcome the above problem, by lowering the absolute value of a threshold voltage of a MOS transistor on the ground side than that of a MOS transistor on the power source side, the gain of a source follower is improved.

Accordingly, in the embodiment, the MOS transistor 211 of the source follower 21 on the power source side is formed on n type well area 16, having higher impurity concentration than the semiconductor substrate, which is formed on the n type semiconductor substrate, and the MOS transistor 212 on the ground side is formed outside of the area 16 on the n type semiconductor substrate. The threshold voltage of the pMOS transistor 211 formed on the area 16 was about −0.75V, and the threshold voltage of the pMOS transistor 212 formed outside of the area 16 was about −0.29V. When two pMOS transistors of a source follower were formed on the same well, gain of the source follower was 0.84. In contrast, gain of the source follower 21 of the present invention was 0.87, which was about 3.5% higher than the gain of the source follower having the former configuration.

Further, when forming MOS transistors of the same conduction type, but having different threshold voltages, it has been necessary to individually control impurity concentration of channels of the MOS transistors. However, by forming a MOS transistor on the power source side on a well whose impurity concentration is higher than a semiconductor substrate and forming a MOS transistor on the ground side outside of the well on the semiconductor substrate, it is possible to form the channels of the both transistors having different threshold voltages in the same manufacturing method.

Next, an operation of the photoelectric conversion device will be explained. Referring to FIG. 1, among the photo-charges generated in response to quantity of light incidented on the photodetector 20, positive charge is stored in the anode of the photodetector 20, and the gate voltage of the pMOS transistor 212 increases in accordance with the stored charges. Then, a bias voltage Vbias is applied to the gate of the pMOS transistor 211, and, when the source follower 21 is ON state, the voltage corresponding to the quantity of incident light is outputted to the output terminal. After a charge storing period is over, a reset pulse Vreset is applied to the gate of the nMOS transistor 22 to turn it on for resetting the photodetector 20, thereby setting the potential of the anode of the photodetector 20 to a reset potential by the reset power source. Thereafter, the nMOS transistor 22 is turned off to start storing photo-charges in the photodetector 20.

In the embodiment, a large number of photodetectors and source followers, e.g., 234 photodetectors and source followers, are arranged in one dimension on the semiconductor substrate 100.

Figure 3:
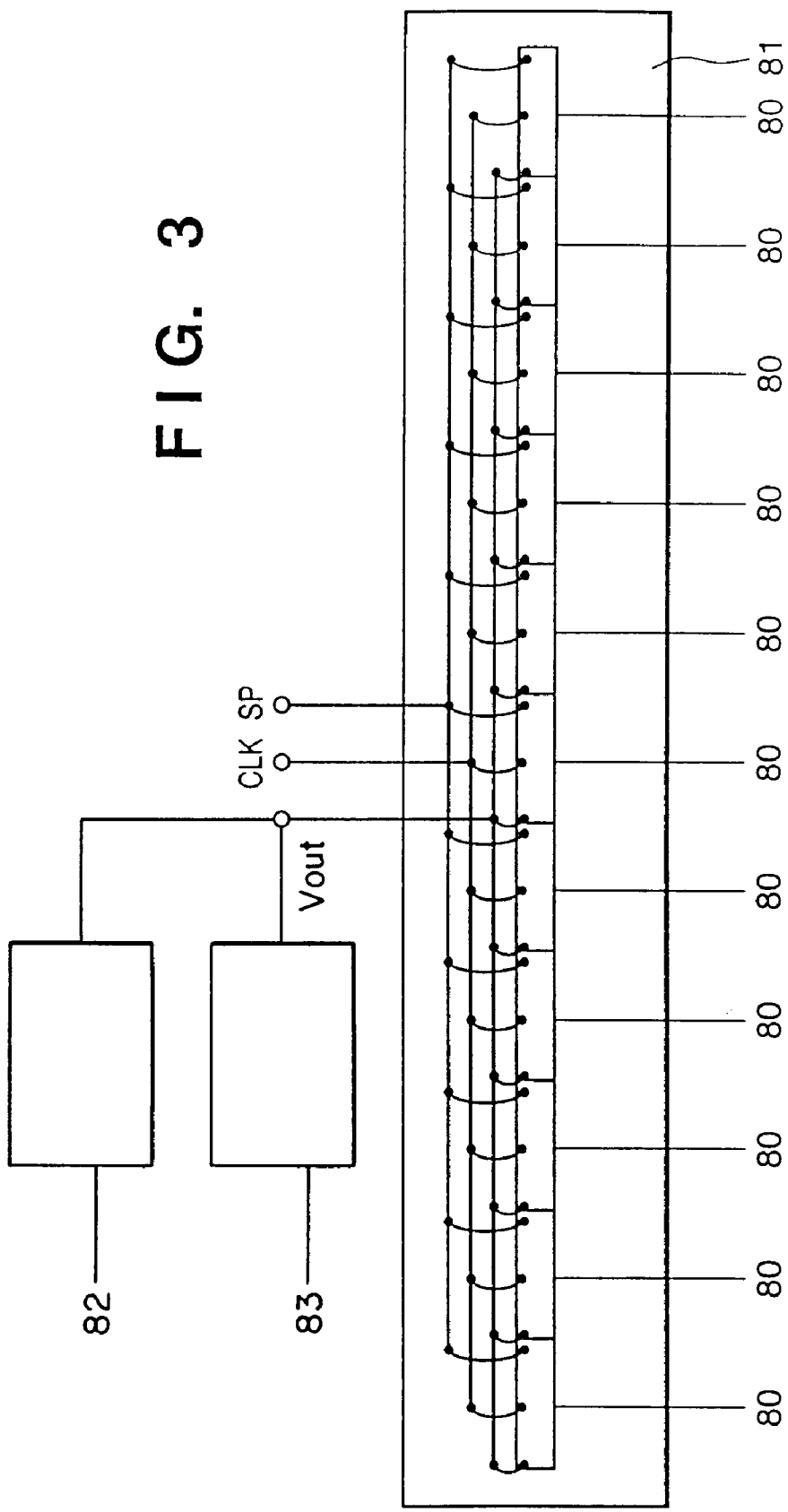
FIG. 3 shows a schematic diagram of an image sensor according to the embodiment of the present invention.
Figure 4:
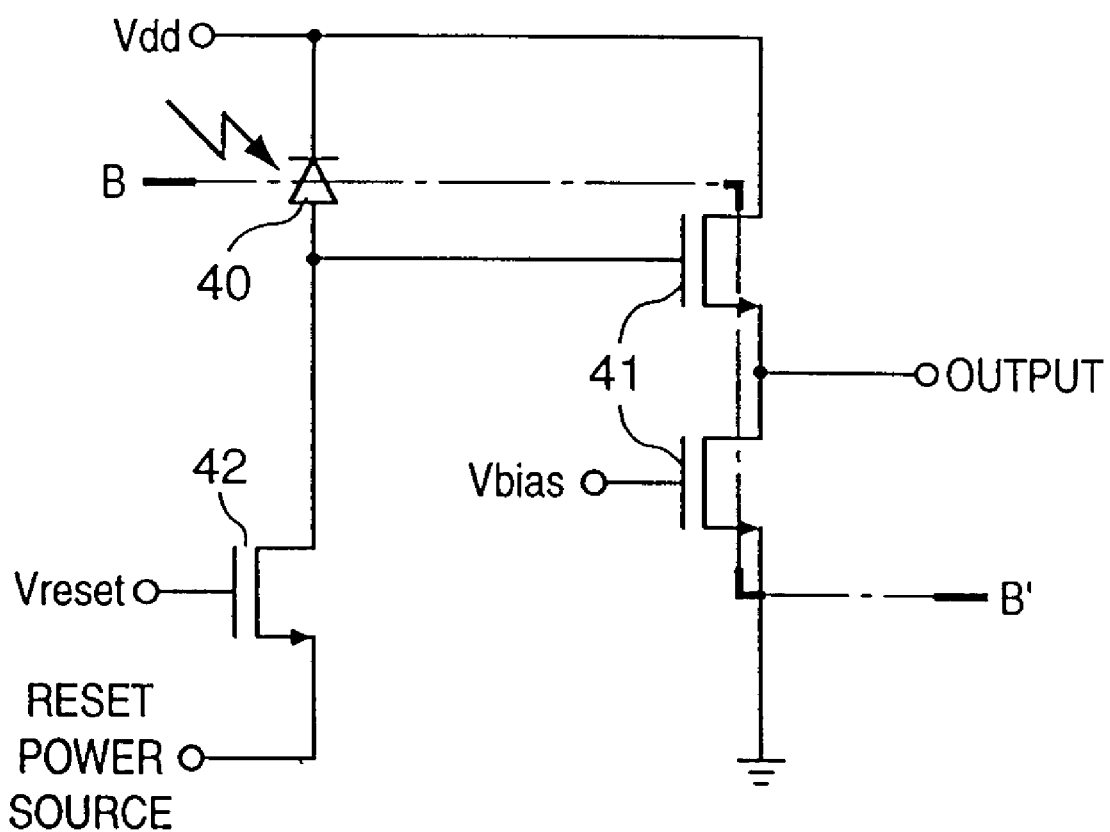
FIG. 4 is a circuit diagram of a pixel of a conventional photoelectric conversion device.
Figure 5:
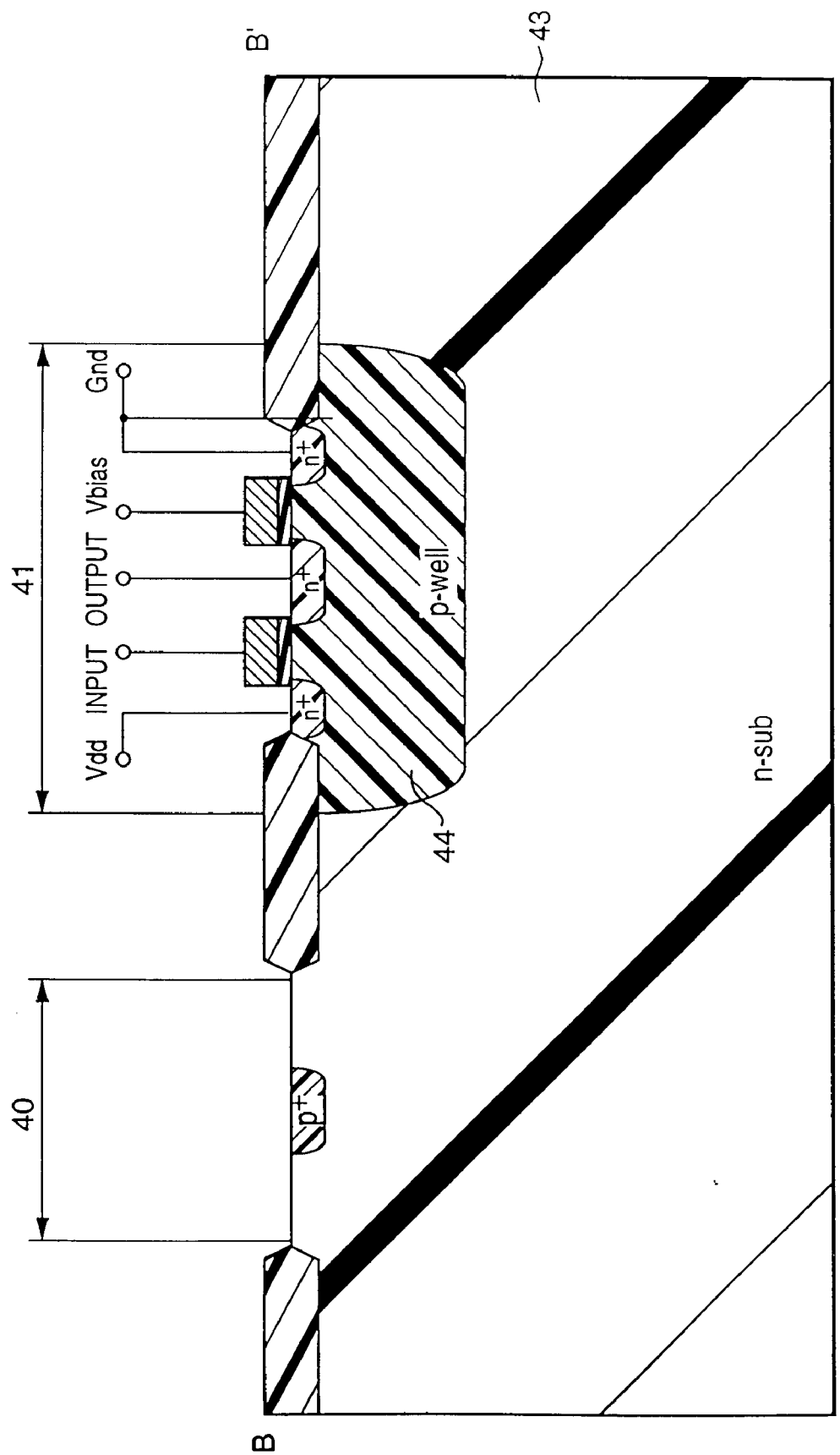
FIG. 5 is a cross-sectional view taken along a line B–B' in FIG. 4.

FIG. 3 shows schematic diagram of an image sensor according to the embodiment of the present invention.

As shown in FIG. 3, eleven photoelectric conversion semiconductor chips 80 each having the configuration of the photoelectric conversion device as shown in FIG. 1 are mounted on a glass epoxy substrate 81 as a photodetector array to form an image sensor conforming to the width of an A4-size document. On the glass epoxy substrate 81, common signal lines for a start pulse SP, a clock CL, and an output control signal $V_{out}$ are connected to input/output pads of each photoelectric semiconductor chip 80 by wire bonding.

First, when the start pulse SP is applied, charges corresponding to quantity of incident light are stored in capacitors, provided in respective photodetector, simultaneously. Then, all the photodetectors are reset, and charge storing operation restarts. Thereafter, the capacitors are sequentially scanned from the first one in response to signals from the shift registers, integrally formed in the chips 80, and voltages corresponding to the charges stored in the capacitors are outputted to the common output line $V_{out}$.

In an experimental result, the level of fixed pattern noise generated when a source follower was configured with pMOS transistors as shown in FIG. 1 was approximately less than a tenth of the level of fixed pattern noise generated when a source follower was configured with nMOS transistors.

Further, in the photoelectric conversion device as described above, charges stored in a plurality of photodetectors are converted into voltages and source followers output the voltages as image signals. The image signals may be read as time-serial image signals via signal processing circuits, such as a shading circuit 82 and a γ correction circuit 83, as output signals of the line sensor and a two-dimensional image sensor, which may be applied to an image reader. For instance, a digital camera, a facsimile machine, and a copying machine provided with the image sensing device obtain image signals of high quality with low fixed pattern noise.

According to the present invention as described above, in a photoelectric conversion device having a plurality of photodetectors and a source follower, storing photo-charges generated by the photodetectors in gate of a MOS transistor and outputting voltage signals converted from the photo-charges, integrally formed on a single semiconductor substrate, by configuring a source follower with pMOS transistors which generates less stray carrier than nMOS transistors, generation of stray carrier is restrained. This reduces the stray carrier entering the photodetectors, thereby lowering fixed pattern noise.

Furthermore, by forming two pMOS transistors of the source follower in different well area, higher gain is achieved comparing to a case of forming transistors in the same well area.

The present invention is not limited to the above embodiments and various changes and modifications can be made within the spirit and scope of the present invention. Therefore to apprise the public of the scope of the present invention, the following claims are made.

What is claimed is:

1. An image sensor having a plurality of photoelectric conversion devices, each of which includes a plurality of pixels formed on a single semiconductor substrate, wherein each pixel comprises:
    a photodetector which generates charge in accordance with quantity of incident light;
    an output transistor that receives signals from said photodetector in a gate region and outputs a corresponding signal from a source region which is a p type semiconductor region; and
    a reset transistor for resetting the gate region of said output transistor, wherein a source region of said reset transistor is an n type semiconductor region.

2. The image sensor according to claim 1, wherein said output transistor is a p-channel MOS transistor and forms a source follower together with at least one p-channel MOS transistor connected in series, and the charge outputted from said photodetector is applied to a gate of the p-channel MOS transistor on the ground side, and the voltage is outputted from a node between the p-channel MOS transistors.

3. The image sensor according to claim 2, wherein an absolute value of a threshold voltage of the p-channel MOS transistor on the ground side is set lower than that of the p-channel MOS transistor on the power source side.

4. The image sensor according to claim 1, wherein said photodetector is formed on a semiconductor area of a second conduction type on the surface of a semiconductor substrate of a first conduction type.

5. The image sensor according to claim 4, wherein the semiconductor area where said photodetector is formed is surrounded by barrier of the first conduction type.

6. The image sensor according to claim 4, wherein the first conduction type is n conduction type, and the second conduction type is p conduction type.

7. The image sensor according to claim 3, wherein said photodetector is formed on a semiconductor area of a second conduction type on the surface of a semiconductor substrate of a first conduction type.

8. The image sensor according to claim 7, wherein the first conduction type is n conduction type, and the second conduction type is p conduction type.

9. The image sensor according to claim 7, wherein the p-channel MOS transistor on the power source side is formed on an n-type well whose impurity concentration is higher than that of an n-type semiconductor substrate, and the p-channel MOS transistor on the ground side is formed on the n-type semiconductor substrate outside of said n-type well.

10. The image sensor according to claim 1, wherein said photodetector is formed by pn junction.

11. The image sensor according to claim 1, wherein said output transistor is a p-channel MOS transistor and said reset transistor is an n-channel MOS transistor.

12. An image processing apparatus comprising:
an image sensor chip formed on a single semiconductor substrate which includes a plurality of pixels; and
a signal processor which processes the signal from said image sensor chip,
wherein each pixel comprises:
a photodetector which generates charge in accordance with quantity of incident light;
an output transistor that receives signals from said photodetector in a gate region and outputs a corresponding signal from a source region which is a p type semiconductor region; and
a reset transistor for resetting the gate region of said output transistor, wherein a source region of said reset transistor is an n type semiconductor region.

13. The image processing apparatus according to claim 12, wherein said output transistor is a p-channel MOS transistor and said reset transistor is all n-channel MOS transistor.

14. The image processing apparatus according to claim 12, wherein said signal processor performs at least one of shading correction and gamma correction.

15. The image processing apparatus according to claim 12, wherein said photodetector is formed by pn junction.

16. The image processing apparatus according to claim 12, wherein said image sensor chip includes a plurality of photoelectric conversion devices, each including said photodetector and said output transistor formed on a single semiconductor substrate.

17. The image processing apparatus according to claim 12, wherein said output transistor is a p-channel MOS transistor and forms a source follower together with at least one p-channel MOS transistor connected in series, and the charge outputted from said photodetector is applied to a gate of the p-channel MOS transistor on the ground side, and the voltage is outputted from a node between the p-channel MOS transistors.

18. The image processing apparatus according to claim 17, wherein an absolute value of a threshold voltage of the p-channel MOS transistor on the ground side is set lower than that of the p-channel MOS transistor on the power source side.

19. The image processing apparatus according to claim 12, wherein said photodetector is formed on a semiconductor area of a second conduction type on the surface of a semiconductor substrate of a first conduction type.

20. The image processing apparatus according to claim 19, wherein the semiconductor area where said photodetector is formed is surrounded by barrier of the first conduction type.

21. The image processing apparatus according to claim 19, wherein the first conduction type is n conduction type, and the second conduction type is p conduction type.

22. The image processing apparatus according to claim 18, wherein said photodetector is formed on a semiconductor area of a second conduction type on the surface of a semiconductor substrate of a first conduction type.

23. The image processing apparatus according to claim 22, wherein the first conduction type is n conduction type, and the second conduction type is p conduction type.

24. The image processing apparatus according to claim 23, wherein the p-channel MOS transistor on the power source side is formed on an n-type well whose impurity concentration is higher than that of an n-type semiconductor substrate, and the p-channel MOS transistor on the ground side is formed on the n-type semiconductor substrate outside of said n-type well.

25. An image processing apparatus comprising:
an image sensor including a plurality of pixels formed on a single semiconductor substrate; and
a signal processor which processes the signal from said image sensor,
wherein each pixel comprises:
a photodetector which generates charge in accordance with quantity of incident light;
an output transistor that receives signals from said photodetector in a gate region and outputs a corresponding signal from a source region which is a p type semiconductor region; and
a reset transistor for resetting the gate region of said output transistor, wherein a source region of said reset transistor is a n type semiconductor region.

26. The image processing apparatus according to claim 25, wherein said photodetector is formed by pn junction.

27. The image processing apparatus according to claim 25, wherein said output transistor is a p-channel MOS transistor and said reset transistor is an n-channel MOS transistor.

28. The image processing apparatus according to claim 25, wherein said signal processor performs at least one of shading correction and gamma correction.

29. An image processing apparatus comprising:
an image sensor having a plurality of photoelectric conversion devices, each of which includes a plurality of pixels formed on a single semiconductor substrate; and
a signal processor which processes the signal from said image sensor,
wherein each pixel comprises:
a photodetector which generates charge in accordance with quantity of incident light;
an output transistor that receives signals from said photodetector in a gate region and outputs a corresponding signal from a source region which is a p type semiconductor region; and
a reset transistor for resetting the gate region of said output transistor, wherein a source region of said reset transistor is an n type semiconductor region.

* * * * *